(12) United States Patent
Kim

(10) Patent No.: US 8,330,183 B2
(45) Date of Patent: Dec. 11, 2012

(54) LIGHT EMITTING ELEMENT AND FABRICATING METHOD THEREOF

(75) Inventor: Yu-Sik Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 210 days.

(21) Appl. No.: 12/761,510

(22) Filed: Apr. 16, 2010

(65) Prior Publication Data
US 2010/0264441 A1    Oct. 21, 2010

(30) Foreign Application Priority Data

Apr. 16, 2009 (KR) .................. 10-2009-0033241

(51) Int. Cl.
H01L 33/14 (2010.01)
(52) U.S. Cl. .............................. 257/99; 257/95; 257/100
(58) Field of Classification Search .................. None
See application file for complete search history.

(56) References Cited

U.S. PATENT DOCUMENTS

| | | | |
|---|---|---|---|
| 4,010,483 A * | 3/1977 | Liu ................... | 257/95 |
| 4,092,561 A * | 5/1978 | Lockwood et al. ........... | 313/499 |
| 4,868,614 A * | 9/1989 | Yamazaki .................. | 257/65 |
| 5,048,035 A * | 9/1991 | Sugawara et al. .......... | 372/45.01 |
| 5,061,974 A * | 10/1991 | Onodera et al. ............. | 257/88 |
| 6,486,500 B1 | 11/2002 | Chen | |
| 6,958,494 B2 * | 10/2005 | Lin et al. .................. | 257/86 |
| 7,105,857 B2 * | 9/2006 | Nagahama et al. ............ | 257/86 |
| 7,816,703 B2 * | 10/2010 | Chen et al. ................. | 257/98 |
| 8,026,531 B2 * | 9/2011 | Seo et al. .................. | 257/99 |
| 8,030,665 B2 * | 10/2011 | Nagahama et al. ............ | 257/79 |
| 2004/0164311 A1 * | 8/2004 | Uemura .................... | 257/99 |
| 2007/0023777 A1 * | 2/2007 | Sonobe et al. ............... | 257/103 |
| 2007/0194325 A1 * | 8/2007 | Sung et al. ................ | 257/79 |
| 2007/0210318 A1 * | 9/2007 | Edmond et al. ............... | 257/79 |
| 2008/0049164 A1 * | 2/2008 | Jeon et al. ................. | 349/61 |
| 2008/0230792 A1 * | 9/2008 | Jiang et al. ................ | 257/94 |
| 2008/0258164 A1 * | 10/2008 | Masui et al. ................ | 257/98 |
| 2010/0072487 A1 * | 3/2010 | Tsai et al. .................. | 257/86 |

FOREIGN PATENT DOCUMENTS

| | | |
|---|---|---|
| KR | 10-0714627 | 4/2007 |
| KR | 10-0813232 | 3/2008 |

OTHER PUBLICATIONS

Huh, Chul, Ji-Myon Lee, Dong-Joon Kim, and Seong-Ju Park. "Improvement in Light-output Efficiency of InGaN/GaN Multiple-quantum Well Light-emitting Diodes by Current Blocking Layer." Journal of Applied Physics 92.5 (2002): 2248.*

(Continued)

*Primary Examiner* — Victor A Mandala
*Assistant Examiner* — Joseph Schoenholtz
(74) *Attorney, Agent, or Firm* — Harness, Dickey & Pierce, P.L.C.

(57) ABSTRACT

The light emitting element includes a substrate; a first block pattern formed on the substrate; a light emitter including a first semiconductor pattern of a first conductivity type, a light emitting pattern, and a second semiconductor pattern of a second conductivity type, sequentially stacked on the substrate having the first block pattern formed thereon, the light emitter having a first portion formed on the first block pattern, and a second portion formed between two adjacent first block patterns, the second portion formed lower than the first portion to define a recessed region, and a second block pattern formed on the light emitter to fill the recessed region.

18 Claims, 20 Drawing Sheets

OTHER PUBLICATIONS

Jeong, Tak. "High-Performance Vertical Light-Emitting Diodes with Buried." Journal of the Electrochemical Society 158.9 (2011): H908-911.*

Kao, C.C. "Enhancement of Light Output Power of GaN-Based Light-Emitting Diodes by a Reflective Current." IEEE Photonics Technology Letters 20.14 (2011): 986-88.*

Lee, Y.J., H.C. Tseng, H.C. Kuo, S.C. Wang, C.W. Chang, T.C. Hsu, Y.L. Yang, M.H. Hsieh, M.J. Jou, and B.J. Lee. "Improvement in Light-output Efficiency of AlGaInP LEDs Fabricated on Stripe Patterned Epitaxy." IEEE Photonics Technology Letters 17.12 (2005): 2532-534.*

Chia-Ming Lee; Chang-Cheng Chuo; Yu-Chuan Liu; I-Ling Chen; Jen-Inn Chyi; , "InGaN-GaN MQW LEDs with current blocking layer formed by selective activation," Electron Device Letters, IEEE , vol. 25, No. 6, pp. 384-386, Jun. 2004.*

Abstract of Korean Publication No. 10-2007-0047047, published on May 4, 2007.

Abstract of Korean Patent Publication No. 10-2007-0006947, published on Jan. 12, 2007.

* cited by examiner

LIGHT EMITTING ELEMENT AND FABRICATING METHOD THEREOF

CROSS-REFERENCE TO RELATED APPLICATION

This application claims priority to Korean Patent Application No. 10-2009-0033241, filed on Apr. 16, 2009, in the Korean Intellectual Property Office, and all the benefits accruing there from under 35 U.S.C. 119, the contents of which in its entirety are herein incorporated by reference.

BACKGROUND

1. Technical Field

Example embodiments relate to a light emitting element and a fabricating method thereof.

2. Description of the Related Art

Light emitting elements such as light emitting diodes (LEDs) emit light when electrons and holes are combined. The light emitting elements have several advantages including lower power consumption, extended life span, being installable without spatial limitation, and robustness against vibration.

A light emitting element may include a p-type electrode, an n-type electrode, and a light emitting pattern for generating light using current flowing from the p-type electrode to the n-type electrode. According to the design of the light emitting element used, the entire area of the light emitting pattern may not be evenly used. Rather, only a partial area of the light emitting pattern may be used. For example, the light emitting pattern may produce light only at a partial area thereof located close to the p-type electrode or the n-type electrode, that is, only at areas of the light emitting pattern positioned in the current path.

SUMMARY

The present invention provides a light emitting element having improved light efficiency and a fabricating method thereof. The above and other objects of the present invention will be described in or be apparent from the following description of example embodiments.

According to an example embodiment, there is provided a light emitting element including a first block pattern formed on a substrate, a light emitter including a first semiconductor pattern of a first conductivity type, a light emitting pattern, and a second semiconductor pattern of a second conductivity type, sequentially stacked on the substrate having the first block pattern formed thereon, the light emitter having a first portion formed on the first block pattern, and a second portion formed between two adjacent first block patterns, the second portion formed lower than the first portion to define a recessed region, and a second block pattern formed on the light emitter to fill the recessed region.

According to an example embodiment, there is provided a light emitting device including a light emitting element on a circuit substrate, the light emitting element including a first block pattern formed on a substrate, a light emitter including a first semiconductor pattern of a first conductivity type, a light emitting pattern, and a second semiconductor pattern of a second conductivity type, sequentially stacked on the substrate having the first block pattern formed thereon, the light emitter having a first portion formed on the first block pattern, and a second portion formed between two adjacent first block patterns, the second portion formed lower than the first portion to define a recessed region and a second block pattern formed on the light emitter to fill the recessed region.

According to an example embodiment, there is provided a fabricating method of a light emitting element including forming a first block pattern on a substrate, and forming a light emitter including a first semiconductor pattern of a first conductivity type, a light emitting pattern, and a second semiconductor pattern of a second conductivity type on the substrate having the first block pattern formed thereon, the light emitter having first portions formed on the first block pattern, and a second portion formed between the first portions of the first block pattern, the second portion formed lower than the first portion to define a recessed region.

BRIEF DESCRIPTION OF THE DRAWINGS

The above and other features and advantages of the present invention will become more apparent by describing in detail example embodiments thereof with reference to the attached drawings in which.

DETAILED DESCRIPTION OF EXAMPLE EMBODIMENTS

Figure 1A:
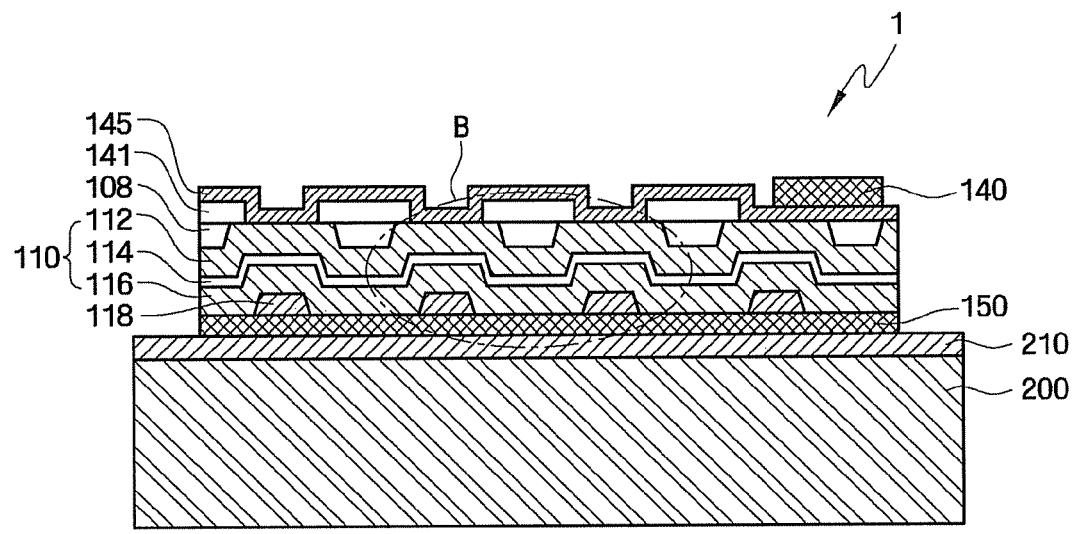
FIG. 1A is a cross-sectional view of a light emitting element according to an example embodiment.

Advantages and features of the present invention and methods of accomplishing the same may be understood more readily by reference to the following detailed description of example embodiments and the accompanying drawings. The present invention may, however, be embodied in many different forms and should not be construed as being limited to example embodiments set forth herein. Rather, these example embodiments are provided so that this disclosure will be thorough and complete and will fully convey the concept of the invention to those skilled in the art, and the present invention will only be defined by the appended claims. In addition, in the drawings, the thickness of layers and regions are exaggerated for clarity.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

Furthermore, relative terms, such as "below," "beneath," "lower," "above" or "upper" may be used herein to describe one element's relationship to other elements as illustrated in the Figures. It will be understood that relative terms are intended to encompass different orientations of the device in addition to the orientation depicted in the Figures.

Example embodiments are described herein with reference to cross-section illustrations that are schematic illustrations of idealized embodiments (and intermediate structures) of the present invention. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. Hereinafter, example embodiments will be described in detail with reference to the accompanying drawings.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 5A:
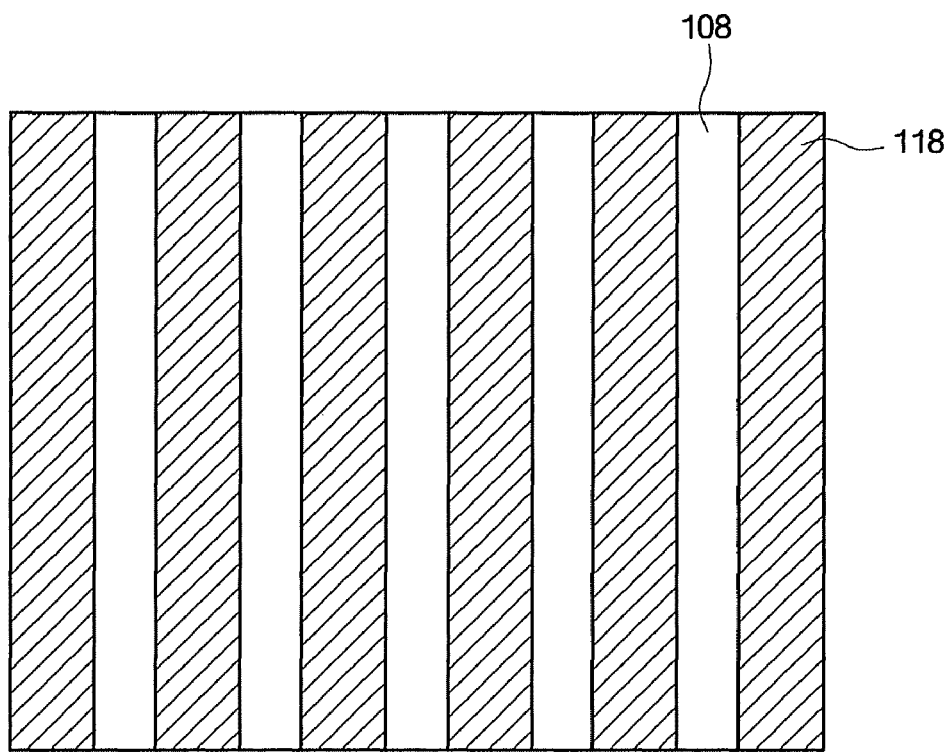
FIGS. 5A and 5B illustrate a relationship between the first and second block patterns used in the light emitting element illustrated in FIG. 1A.
Figure 5B:
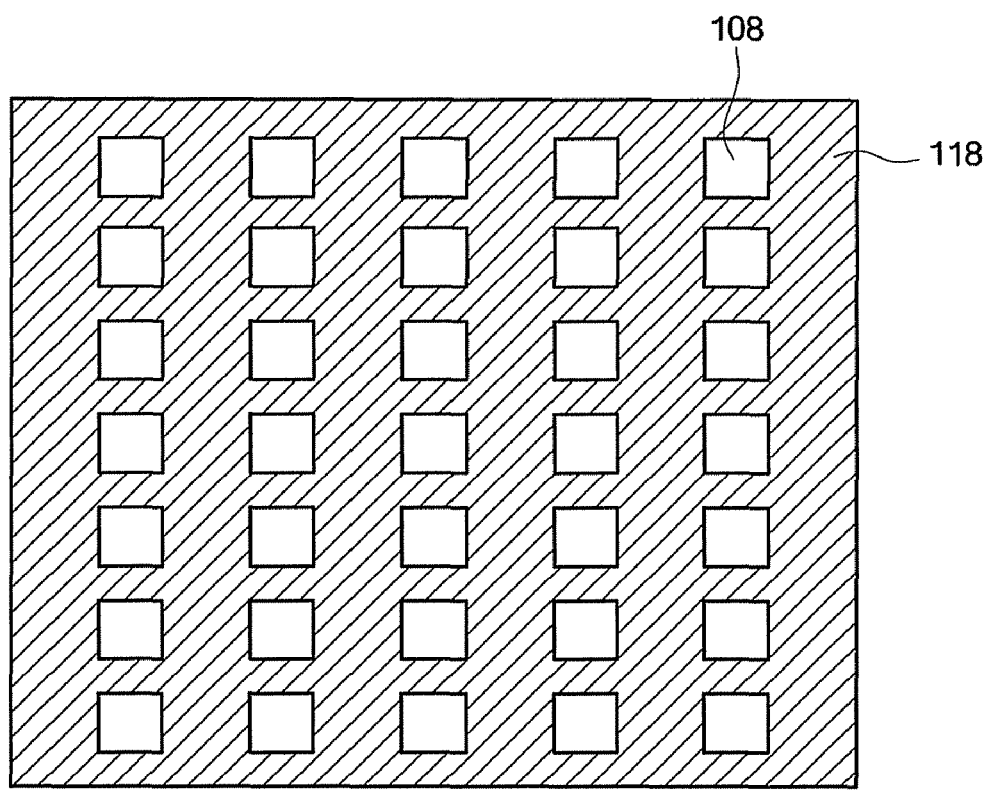
Figure 6:
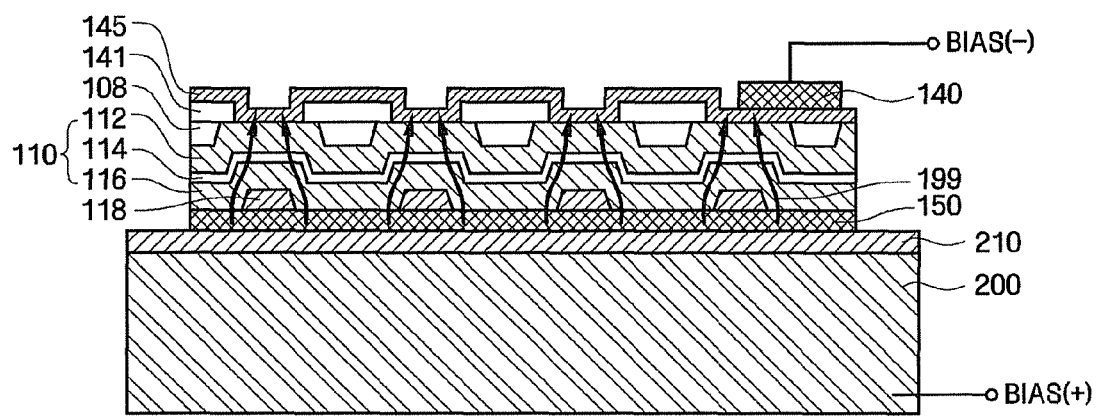
FIG. 6 illustrates an operation of the light emitting element illustrated in FIG. 1A.

FIGS. 1A through 6 illustrate a light emitting element according to an example embodiment. In detail, FIG. 1A is a cross-sectional view of a light emitting element according to an example embodiment, FIG. 1B is a detailed diagram of a portion "B" of FIG. 1A, FIGS. 2 through 4 illustrate examples of first and second block patterns used in the light emitting element illustrated in FIG. 1A, FIGS. 5A and 5B illustrate a relationship between the first and second block patterns used in the light emitting element illustrated in FIG. 1A, and FIG. 6 illustrates an operation of the light emitting element illustrated in FIG. 1A. Although the light emitting element illustrated in FIGS. 1A through 6 is a vertical type light emitting element, example embodiments are not limited thereto.

Referring to FIG. 1A, the light emitting element 1 according to an example embodiment includes a light emitter 110 that produces light, a first electrode 140 for applying power to the light emitter 110, a second electrode 150, and first and second block patterns 108 and 118 that increase light efficiency of the light emitter 110 by controlling the flow of current flowing across the light emitter 110. Specifically, in this example embodiment, since at least one of the first and second block patterns 108 and 118 serves as a Schottky barrier, the current flow can be controlled. FIG. 1 illustrates that the second block pattern 118 serves as a Schottky barrier, but example embodiments are not limited thereto.

In the following description, various functional components of the light emitting element 1 will first be described, and the current flow controlled by the first and second block patterns 108 and 118 will later be described.

The second electrode 150 may be formed on a conductive substrate 200 using a highly reflective material. The second electrode 150 may be made of, for example, at least one of silver (Ag) and aluminum (Al). The light produced from the light emitter 110 is reflected at the second electrode 150 to then be emitted outside the light emitting element 1, which will later be described.

The second block pattern 118 may be formed on the second electrode 150 to be patterned to partially expose the second electrode 150. The second block pattern 118 may be patterned in various manners, including for example, a line type (see FIG. 2), a mesh type (see FIG. 3), or a dot type (see FIG. 4). The second block pattern 118 may be a semiconductor pattern of a first conductivity type (e.g., n type). Since the second block pattern 118 has a different conductivity type from the second conductive pattern 116 of the light emitter 110 in contact therewith, the second block pattern 118 serves as a Schottky barrier.

The light emitter 110 is formed on the second electrode 150 having the second block pattern 118 formed thereon, and includes the second conductive pattern 116 of a second conductivity type (e.g., p type), the light emitting pattern 114, and the first conductive pattern 112 of a first conductivity type (e.g., n type), sequentially stacked one on another.

The second conductive pattern 116, the light emitting pattern 114, and the first conductive pattern 112 may include $In_xAl_yGa_{(1-x-y)}N$ ($0 \leq x \leq 1$, $0 \leq y \leq 1$) (that is, various materials including GaN). For example, the second conductive pattern 116, the light emitting pattern 114, and the first conductive pattern 112 may be AlGaN or InGaN. The second conductive pattern 116, the light emitting pattern 114, and the first conductive pattern 112 will now be described in detail, respectively. The light emitting pattern 114 is a region where carriers (that is, holes) of the first conductive pattern 112 are recombined with carriers (that is, electrons) of the second conductive pattern 116 in the light emitting pattern 114 to then generate light.

Although not clearly illustrated, the light emitting pattern 114 may include a well layer and a barrier layer. Since a well layer has a smaller band gap than the barrier layer, carriers (that is, electrons and holes) gather in the well layer to then be recombined in the light emitting pattern 114. The light emitting pattern 114 may be classified into a single quantum well (SQW) structure, and a multiple quantum well (MQW) structure according to the number of well layers. In detail, the light emitting pattern 114 having an SQW structure has a single well layer, and the light emitting pattern 114 having an MQW structure has multiple well layers. In order to adjust emission characteristics, at least one selected from B, P, Si, Mg, Zn, and Se may be doped into at least one of the well layer and the barrier layer.

Meanwhile, the first block pattern 108 is formed on the first conductive pattern 112. The first block pattern 108 may be patterned in various manners, including for example, a line type (see FIG. 2), a mesh type (see FIG. 3), or a dot type (see FIG. 4). The first block pattern 108 may serve as a seed layer when forming (growing) the first conductive pattern, which will later be described in the description of a fabricating method of the light emitting element.

Use of a seed layer improves crystallinity of the first conductive pattern 112, the light emitting pattern 114, and the second conductive pattern 116. As the seed layer, any material may be used as long as it can serve as a seed layer, and examples thereof include $In_xAl_yGa_{(1-x-y)}N$ ($0 \leq x \leq 1$, $0 \leq y \leq 2$), and $Si_xC_yN_{(1-x-y)}$ ($0 \leq x \leq 1$, $0 \leq y \leq 1$).

Figure 1B:
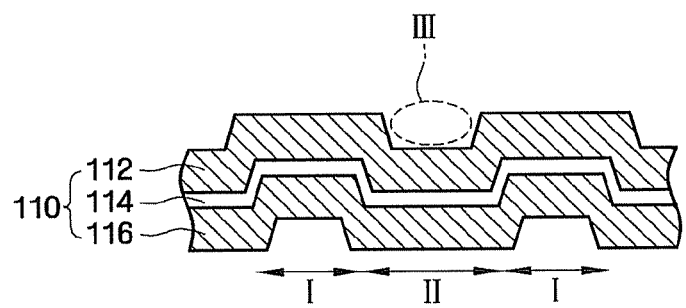
FIG. 1B is a detailed diagram of a portion "B" of FIG. 1A.
Figure 2:
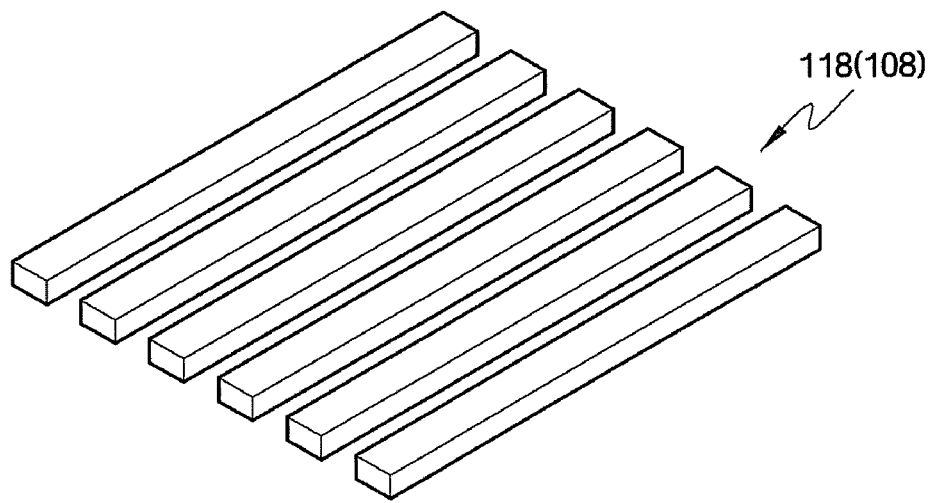
FIGS. 2 through 4 illustrate examples of first and second block patterns used in the light emitting element illustrated in FIG. 1A.
Figure 3:
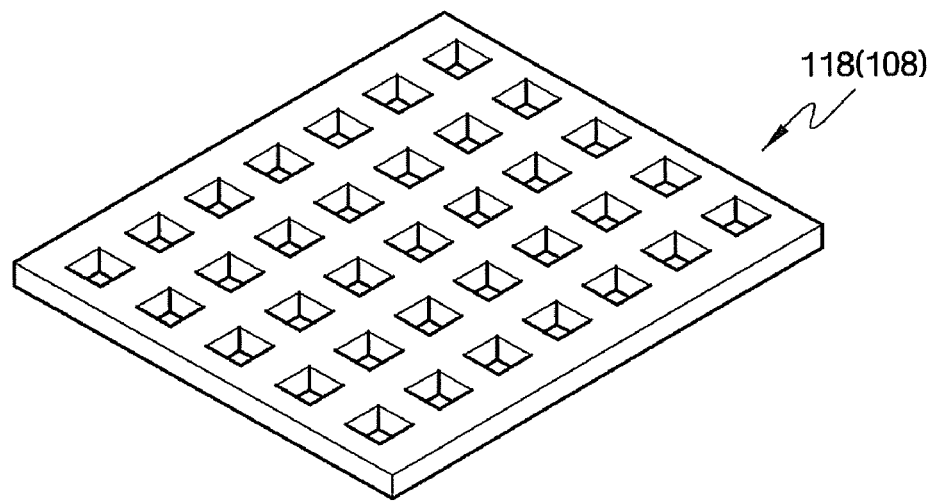
Figure 4:
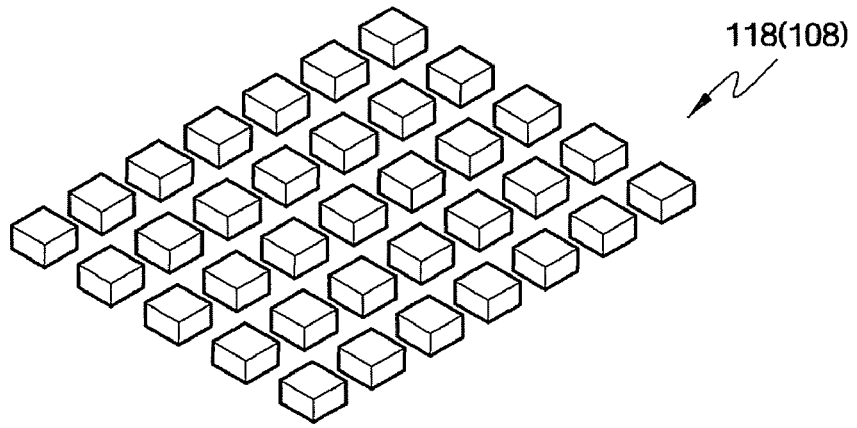

Meanwhile, as illustrated in FIGS. 1A and 1B, the light emitter 110 is constructed to be between the first block pattern 108 and the second block pattern 118. In more detail, the light emitter 110 may be defined by a first portion (I) formed on the second block pattern 118, and a second portion (II) formed between two adjacent second block patterns 118. Since a top surface of the second portion (II) is lower than that of the first portion (I), a region between two adjacent first portions (I), that is, a region overlying the second portion (II) may be defined as a recessed region (III). The first block pattern 108 fills the recessed region (III). For example, when the first block pattern 108 completely fills the recessed region (III), the top surface of the first portion (I) and the top surface of the first block pattern 108 may become planarized.

The insulation pattern 141 may be formed on the first block pattern 108. For example, an insulation pattern 141 may be formed conformally on the first block pattern 108. For example, if the first block pattern 108 is formed in a line type, the insulation pattern 141 is also formed in a line type. If the first block pattern 108 is formed in a mesh type, the insulation pattern 141 is also faulted in a mesh type. The insulation pattern 141 may be oxide, nitride, or oxynitride, but example embodiments are not limited thereto. In FIG. 1, the material used to form the first block pattern 108 and the used to form the insulation pattern 141 may be interchangeable. In addition, although not illustrated in FIG. 1, the insulation pattern 141 may not be formed.

The ohmic layer 145 may be formed on the light emitter 110 having the insulation pattern 141 formed thereon. The ohmic layer 145 may include, for example, at least one of ITO (Indium Tin Oxide), zinc (Zn), zinc oxide (ZnO), silver (Ag), titanium (Ti), aluminum (Al), gold (Au), nickel (Ni), indium oxide ($In_2O_3$), tin oxide ($SnO_2$), copper (Cu), tungsten (W), and platinum (Pt). The ohmic layer 145 improves spreading of current while suppressing crowding of current flowing from the first electrode 140 to the first conductive pattern 112.

The first electrode 140 is formed on the ohmic layer 145 and is electrically connected to the first conductive pattern 112. The first electrode 140 may be formed at one side of the light emitter 110, which is to prevent or reduce a traveling path of the light generated from the light emitter 110 from obstructing. In addition, the first electrode 140 may include at least one of indium tin oxide (ITO), copper (Cu), nickel (Ni), chrome (Cr), gold (Au), titanium (Ti), platinum (Pt), aluminum (Al), vanadium (V), tungsten (W), molybdenum (Mo), and silver (Ag).

The conductive substrate 200 may be made of a conductive material, and examples thereof may include Si, strained Si, Si alloy, SOI (Silicon-On-Insulator), SiC, SiGe, SiGeC, Ge, Ge alloy, GaAs, InAs, one of Group III-V semiconductors, one of Group II-VI semiconductors, composites of these materials, and stacks thereof.

An intermediate material layer 210 may be formed between the conductive substrate 200 and the second electrode 150. The intermediate material layer 210 is used to bond the conductive substrate 200 and the second electrode 150 to each other. The intermediate material layer 210 may be made of a conductive material, and examples thereof may include a metal layer. When the intermediate material layer 210 is a metal layer, the intermediate material layer 210 may include, for example, at least one of Au, Ag, Pt, Ni, Cu, Sn, Al, Pb, Cr, and Ti. The metal layer may be a single layer made of Au, Ag, Pt, Ni, Cu, Sn, Al, Pb, Cr, or Ti, a stack thereof, or a composite thereof. For example, the metal layer may be a single layer of Au, a double layer of Au—Sn, or a multi-layer having a number of alternately stacked layers of Au and Sn. The intermediate material layer 210 may be made of a material having a lower reflective index than the second electrode 150.

FIG. 1A illustrates that the intermediate material layer 210 is formed along a profile of the conductive substrate 200, but example embodiments are not limited thereto. For example, the intermediate material layer 210 may be formed conformally along a profile of the second electrode 150.

Although not illustrated, a barrier layer may be formed between the second electrode 150 and the intermediate material layer 210. The barrier layer prevents or reduces damage to the second electrode 150 that reflects light. The barrier layer may include, for example, at least one of TiW and Pt.

In addition, although not illustrated, a surface of the first conductive pattern 112 may be texture-shaped. The light having an angle except for the escape cone angle, is trapped in the first conductive pattern 112 due to a refractive index difference between the first conductive pattern 112 and air. Accordingly, a relatively large amount of light can be escaped from the first conductive pattern 112 by forming the texture-shaped surface on the first conductive pattern 112, thereby increasing the light extraction efficiency.

Hereinafter, structures of the first and second block patterns 108 and 118 will be described. FIGS. 5A and 5B are diagrams of the overlapped first and second block patterns 108 and 118 when viewed from the top surface of the light emitting element 1.

The first and second block patterns 108 and 118 may be complementary to each other in view of their shapes. In other words, the first and second block patterns 108 and 118 may be alternately disposed with respect to each other. Alternatively, when viewed from the top surface of the light emitting element 1 (that is, when viewed from the first electrode 140), the second block pattern 118 may not be positioned at a portion where the first block pattern 108 is positioned, while the second block pattern 118 may be positioned at a portion where the first block pattern 108 is not positioned. Of course, there may be an overlapping portion of the first block pattern 108 and the second block pattern 118.

For example, as illustrated in FIG. 5A, both of the first and second block patterns 108 and 118 may be formed in a line type. For convenience of illustration, the first block pattern 108 is shaded. For example, as illustrated in FIG. 5B, the first block pattern 108 may be formed in a dot type and the second block pattern 118 may be formed in a mesh type. Conversely, the first block pattern 108 may be formed in a mesh type and the second block pattern 118 may be formed in a dot type. Controlling bias flow between the first and second block patterns 108 and 118 will be described.

As illustrated in FIG. 6, for example, when the second conductive pattern 116 is a p-type, and the first conductive pattern 112 is an n-type, a bias (V+ or I+) is applied to the second conductive pattern 116 through the second electrode 150, another bias (V−, I−, or ground) is applied to the first conductive pattern 112 through the first electrode 140 and the ohmic layer 145. That is to say, the bias (V+ or I+) is applied to the second conductive pattern 116 and the bias (V−, I−, or ground) is applied to the first conductive pattern 112, so that a forward bias is applied to the light emitter 110. The forward bias allows light to be generated from the light emitting pattern 114. The generated light is reflected at the second electrode 150 to then escape to an area external from the light emitter 110. Alternatively, the generated light may be directly emitted to an area external from the light emitter 110.

When the forward bias is applied to the light emitter 110 in the above-described manner, current 199 flows from the second electrode 150 to the first electrode 140. The light emitting element 1 according to an example embodiment includes the first and second block patterns 108 and 118, which controls the flow of the current 199. That is to say, the first and second block patterns 108 and 118 distribute the flow of the current 199. In particular, as described above, if the first and second block patterns 108 and 118 are complementarily formed, the current 199 may flow through almost the entire area of the light emitting pattern 114. Therefore, the light is emitted from almost the entire area of the light emitting pattern 114, thereby improving the light efficiency of the light emitting element 1.

In particular, the second block pattern 118 has a first conductivity type (e.g., n type), and the second conductive pattern 116 has a second conductivity type (e.g., p type), the second block pattern 118 serving as a Schottky barrier. That is to say, the current 199 makes a detour around the second block pattern 118 to flow to the second conductive pattern 116, instead of passing through the second block pattern 118 to flow to the second conductive pattern 116. In other words, the second block pattern 118 controls the flow of the current 199.

As auxiliary means for controlling the flow of the current 199, the insulation pattern 141 is formed on the first block pattern 108. Therefore, the bias (V−, I−, or ground) applied to the first electrode 140 can be more easily propagated only to the first conductive pattern 112 without being propagated to the first block pattern 108. In order for the first and second block patterns 108 and 118 to control the flow of the current 199, the first and second block patterns 108 and 118 may be positioned along a path of the current flowing between the first electrode 140 and the second electrode 150. If the first and second block patterns 108 and 118 are out of the current path, controlling the flow of the current 199 is difficult.

For example, if the first electrode 140 is formed at a higher level than the second electrode 150, the light emitting pattern 114 is formed at the same level as or a higher level than the second electrode 150, and the light emitting pattern 114 is formed at a lower level than the first electrode 140, the second block pattern 118 is formed at the same level as or a higher level than the second electrode 150 and at a lower level than the light emitting pattern 114, and the first block pattern 108 is formed at a higher level than the light emitting pattern 114 and at the same level as or at a lower level than the first electrode 140. The term 'level' is a physical concept used to mean that a component 'a' at a higher/lower level than a component 'B' is physically positioned at a higher/lower position than the component 'b'.

For example, if the second block pattern 118 is at a lower level than the second electrode 150, it is difficult for the second block pattern 118 to affect the current 199 flowing from the second electrode 150 or the current 199 flowing to the second electrode 150. Therefore, it is difficult to use the second block pattern 118 in controlling the flow of the current 199.

Figure 7:
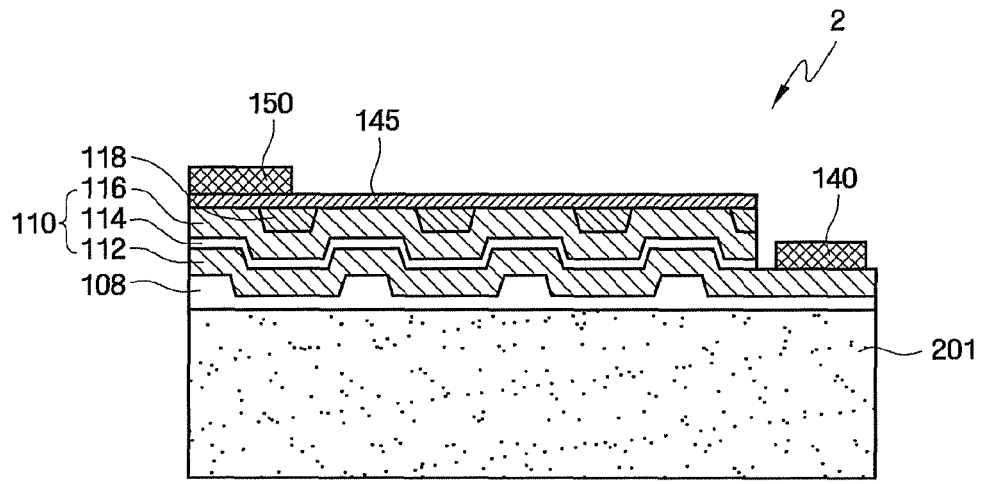
FIG. 7 is a cross-sectional view of a light emitting element according to an example embodiment.

FIG. 7 is a cross-sectional view of a light emitting element according to an example embodiment. While the illustrated light emitting element is a lateral type LED, example embodiments are not limited thereto. Since a flip chip type LED is formed by reversing the lateral type LED and then connecting the same to a circuit substrate, the following description will also be applied to a flip chip type LED.

Referring to FIG. 7, the light emitting element 2 according to an example embodiment includes a light emitter 110 formed on an insulating substrate 201, and the light emitter 110 includes a first conductive pattern 112 of a first conductivity type, a light emitting pattern 114, and a second conductive pattern 116 of a second conductivity type, which are sequentially stacked. Since the light emitting element 2 is of a lateral type, both of first and second electrodes 140 and 150 are formed on the same surface of the light emitter 110.

Any material that can grow the light emitter 110 may be used as the insulating substrate 201, and examples thereof may include an insulating substrate such as sapphire ($Al_2O_3$), or zinc oxide (ZnO), and a conductive substrate such as silicon (Si), or silicon carbide (SiC).

Specifically, the first block pattern 108 may be formed on the insulating substrate 201. As illustrated in FIG. 7, the first block pattern 108 may be formed below the entire area of the light emitter 110, rather than under partial areas. That is to say, the first block pattern 108 is formed under the entire area of the light emitter 110 while having different thicknesses at particular regions, so that it may be formed in a line type (see FIG. 2), a mesh type (see FIG. 3), or a dot type (see FIG. 4). The light emitter 110 is formed conformally on the insulating substrate 201 having the first block pattern 108. In detail, the light emitter 110 may be defined by a first portion formed on the first block pattern 108, and a second portion formed between two adjacent first block patterns 108, defining a recessed region. The second block pattern 118 may be formed to fill the recessed region.

An ohmic layer 145 may be formed on the light emitter 110 and the second block pattern 118. The second electrode 150 may be formed at one side of the light emitter 110. For example, the second electrode 150 may be formed at a side opposite to the first electrode 140, so that the second electrode 150 becomes far from the first electrode 140. Since the second electrode 150 is formed at one side of the light emitter 110, it is possible to avoid the light generated from the light emitter 110 from being shielded by the second electrode 150.

Hereinafter, light emitting devices fabricated using the aforementioned light emitting elements 1 and 2 will be described. For simplicity of description, a light emitting device fabricated using the light emitting element 1 according to an example embodiment is illustrated, but example embodiments are not limited thereto. It is obvious that one skilled in the art to which example embodiments pertain can make the light emitting device using the light emitting element 2 according to an example embodiment.

Figure 8:
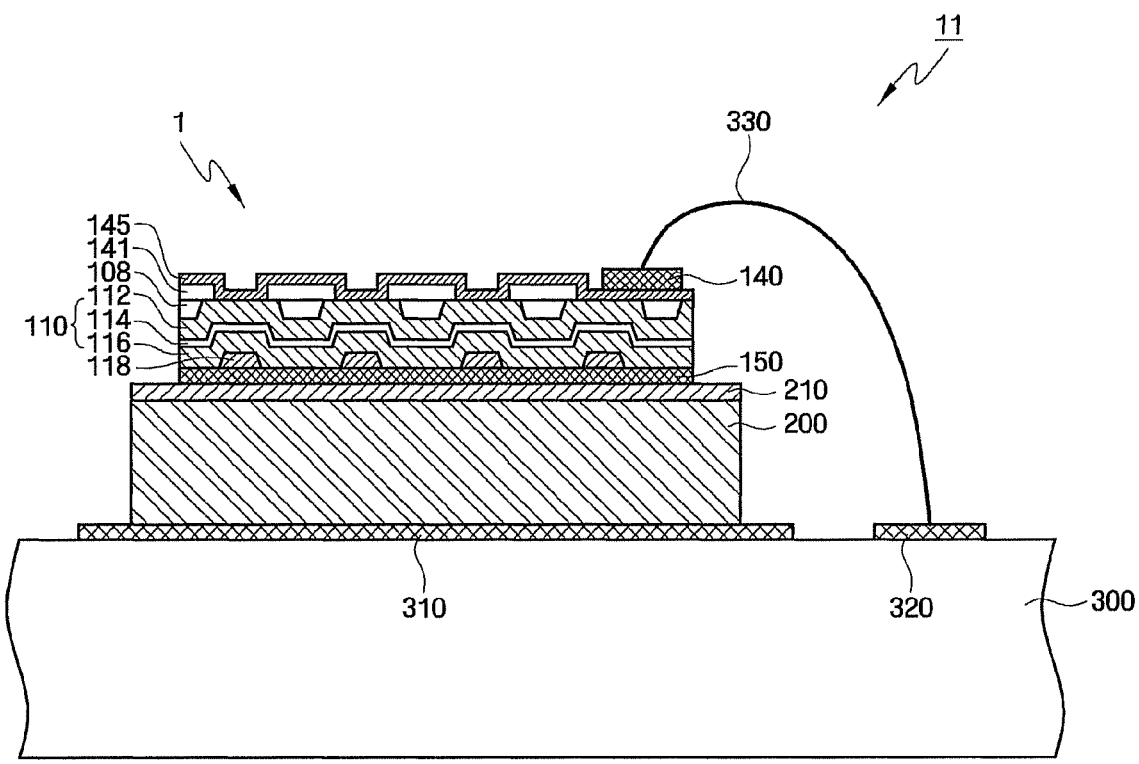
FIGS. 8-20 illustrate a light emitting device according to example embodiments.

FIG. 8 illustrates a light emitting device according to an example embodiment. Referring to FIG. 8, the light emitting device 11 according to an example embodiment includes a circuit substrate 300 and a light emitting element 1 disposed on the circuit substrate 300.

The circuit substrate 300 includes a first conductive region 310 and a second conductive region 320 electrically disconnected from each other. The first conductive region 310 and the second conductive region 320 are disposed on one surface of the circuit substrate 300.

The first conductive region 310 is electrically connected to the conductive substrate 200 of the light emitting element 1 (that is, the second electrode 150), and the second conductive region 320 is electrically connected to the first electrode 140 of the light emitting element 1. The second conductive region 320 and the first electrode 140 are connected to each other through a wire 330. That is to say, the second conductive region 320 and the first electrode 140 may be connected to each other by wire bonding. Since the conductive substrate 200 is a conductive substrate, the first conductive region 310 may be connected to the conductive substrate 200 without a separate wire.

Figure 9:
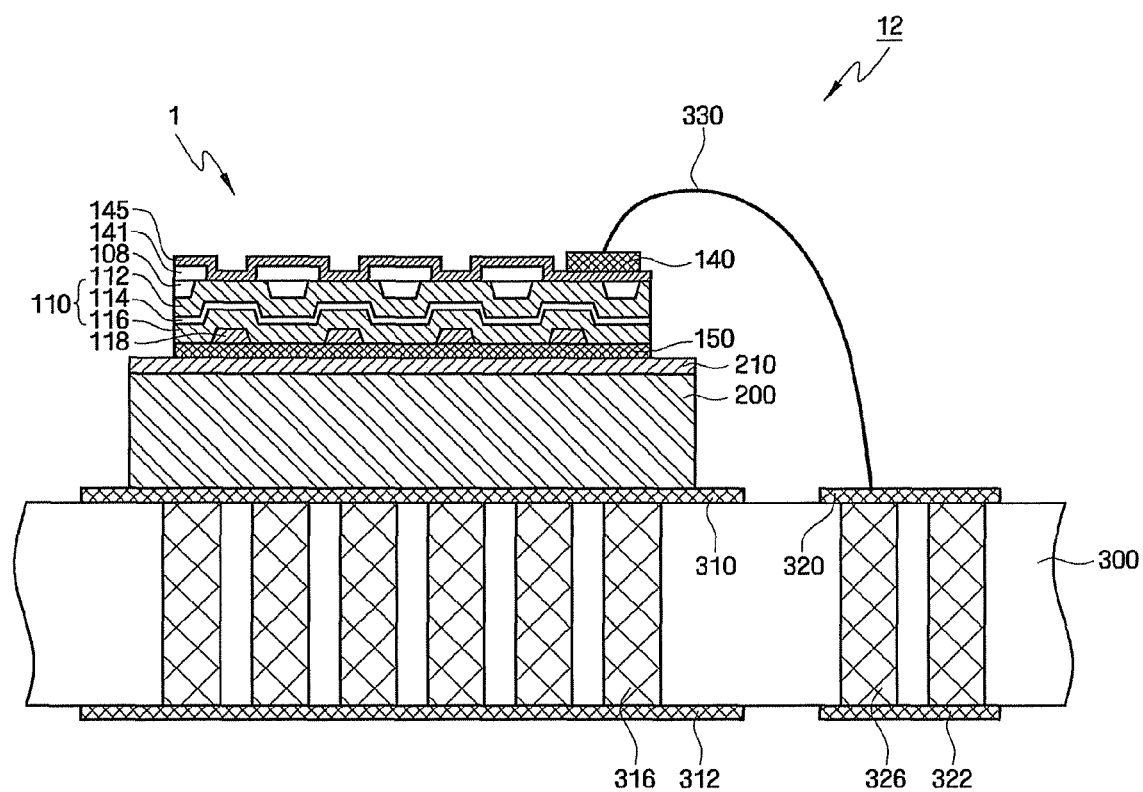

FIG. 9 illustrates a light emitting device according to an example embodiment. The light emitting device 12 according to an example embodiment as illustrated in FIG. 9 is different from the light emitting device 11 according to an example embodiment as illustrated in FIG. 8 in that a circuit substrate 300 includes through vias 316 and 326.

In detail, a first conductive region 310 and a second conductive region 320 electrically disconnected from each other are formed on one surface of the circuit substrate 300. A third conductive region 312 and a fourth conductive region 322 electrically disconnected from each other are formed on the other surface of the circuit substrate 300. The first conductive region 310 and the third conductive region 312 are connected to each other through the first through via 316, and the second conductive region 320 and the fourth conductive region 322 are connected to each other through the second through via 326. The first conductive region 310 is electrically connected to the conductive substrate 200 of the light emitting element 1, and the second conductive region 320 is electrically connected to the first electrode 140 of the light emitting element 1.

Figure 10:
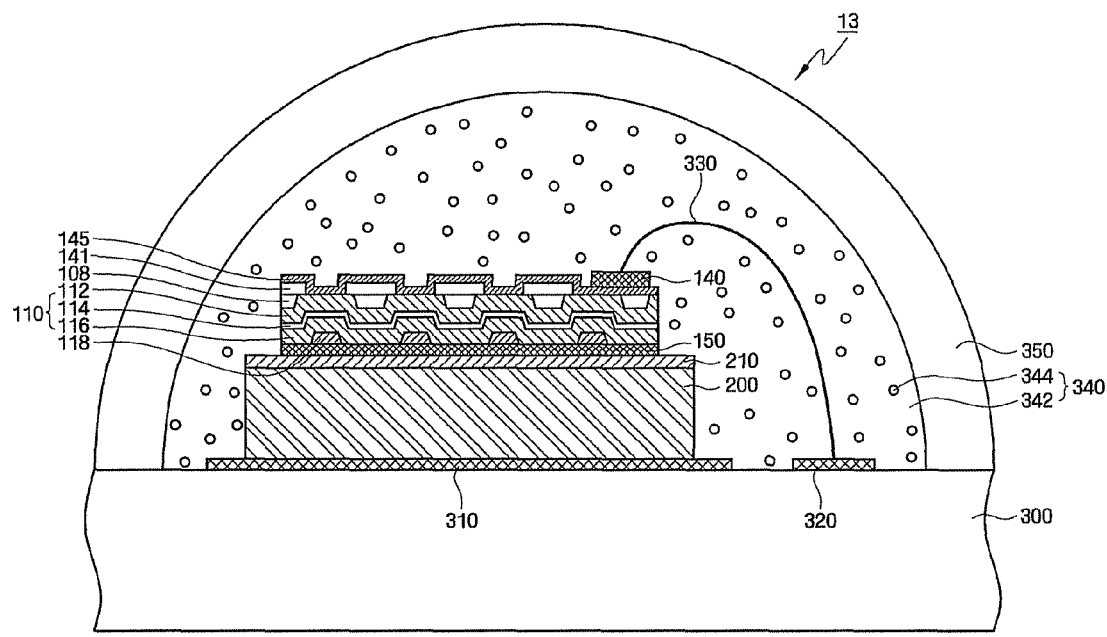

FIG. 10 illustrates a light emitting device according to an example embodiment. The light emitting device 13 according to an example embodiment as illustrated in FIG. 10 is different from the light emitting device 11 according to an example embodiment as illustrated in FIG. 8 in that a phosphor layer 340 surrounds the light emitting element 1, and a first transparent resin 350 surrounds the phosphor layer 340.

The phosphor layer 340 may be a mixture of the second transparent resin 342 and a phosphor 344. The phosphor 344 dispersed in the phosphor layer 340 absorbs the light emitted from the light emitting element 1 and converts the wavelength of the absorbed light into light of a different wavelength. Accordingly, the phosphor distribution is more improved when the emission characteristic is improved. In this case, effects of wavelength conversion and color mixing by the phosphor 344 can be improved. As illustrated, in order to protect the wire 330, the phosphor layer 340 may be formed to be higher than the wire 330.

For example, in order for the light emitting device 13 to produce white light, the light emitting device 13 may includes the phosphor layer 340. When the light emitting element 1 emits blue wavelength light, the phosphor 344 may include a yellow phosphor. In order to increase a color rendering index (CRI) characteristic, the phosphor 344 may include a red phosphor. Alternatively, if the light emitting element 1 emits light with an ultraviolet (UV) wavelength, the phosphor layer 344 may include all of red, green, and blue (RGB) phosphors.

A second transparent resin 342 may be formed of any material without any particular limitation as long as the material can be stably dispersable. Examples of the second transparent resin 342 may include epoxy resin, silicon resin, hard silicon resin, modified silicon resin, urethane resin, oxetane resin, acryl resin, polycarbonate resin, and polyimide resin.

In addition, any material that is capable of absorbing light from the light emitter 110 and converting the absorbed light into light of a different wavelength may be used as the phosphor 344. For example, the phosphor 344 may be at least one selected from the group consisting of a nitride-based/oxynitride-based phosphor (mainly activated by lanthanoids such as Eu and Ce), an alkaline earth halogen apatite phosphor, an alkaline earth metal borate halogen phosphor, an alkaline earth metal aluminate phosphor, an alkaline earth silicate phosphor, an alkaline earth sulfide phosphor, an alkaline earth thiogallate phosphor, a thiosilicate phosphor, an alkaline earth silicon nitride phosphor, and a germinate phosphor (mainly activated by lanthanoids such as Eu or transition metals such as Mn), a rare earth aluminate phosphor (mainly activated by lanthanoids such as Ce), a rare earth silicate phosphor, an organic material or organic complex (mainly activated by lanthanoids such as Ce).

In addition to the phosphors stated above, any phosphor can be used as the phosphor 344 as long as it exhibits the same performance and effect. The first transparent resin 350 is lens-shaped and diffuses the light emitted from the light emitting element 1. Light diffusion/extraction characteristics can be controlled by adjusting the curvature and planarity of the first transparent resin 350. In addition, since the first transparent resin 350 is formed to surround the phosphor layer 340, it is capable of protecting the phosphor layer 340 to prevent or reduce the phosphor 344 contained in the phosphor layer 340 from being exposed to moisture because the phosphor layer 340 is liable to deteriorate when the phosphor 344 contacts moisture.

The first transparent resin 350 may be formed of any material without any particular limitation as long as it can transmit the light. Examples of the first transparent resin 350 may include epoxy resin, silicon resin, hard silicon resin, modified silicon resin, urethane resin, oxetane resin, acryl resin, polycarbonate resin, and polyimide resin.

Figure 11:
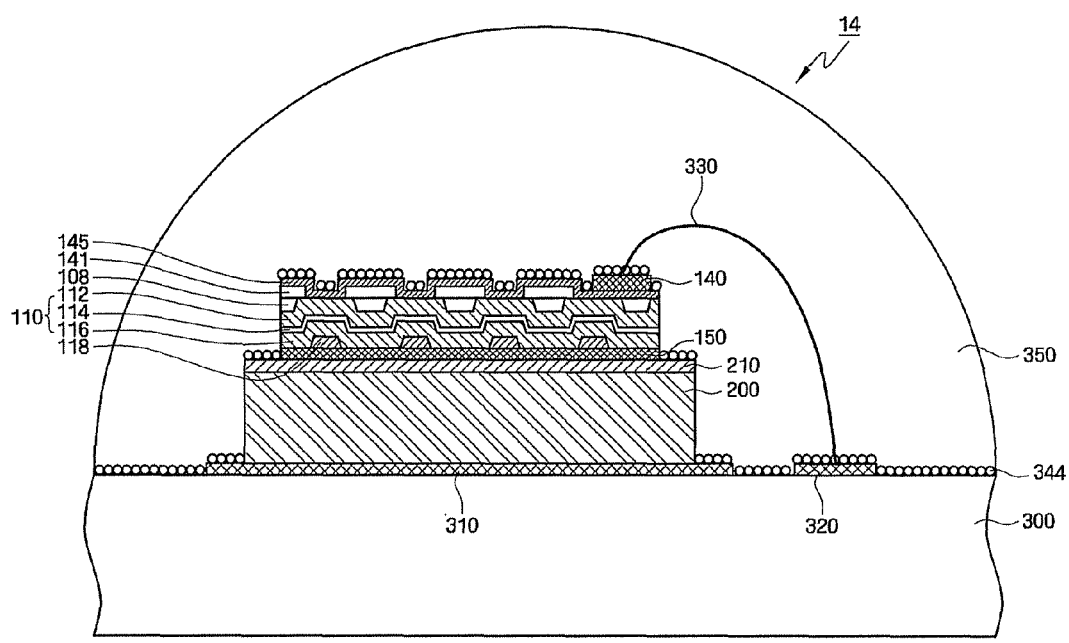

FIG. 11 illustrates a light emitting device according to an example embodiment. Referring to FIG. 11, a phosphor 344 is formed conformally on a light emitting element 1 and a circuit substrate 300 along a profile of the light emitting element 1 and the circuit substrate 300. In such a case, the phosphor 344 may be coated on the light emitting element 1 and the circuit substrate 300 without separately forming a second transparent resin (see 342 of FIG. 10). In this case, the transparent resin surrounding the light emitting element 1 is a single layer (that is, a single layer 350 without the second transparent resin 342).

Figure 12:
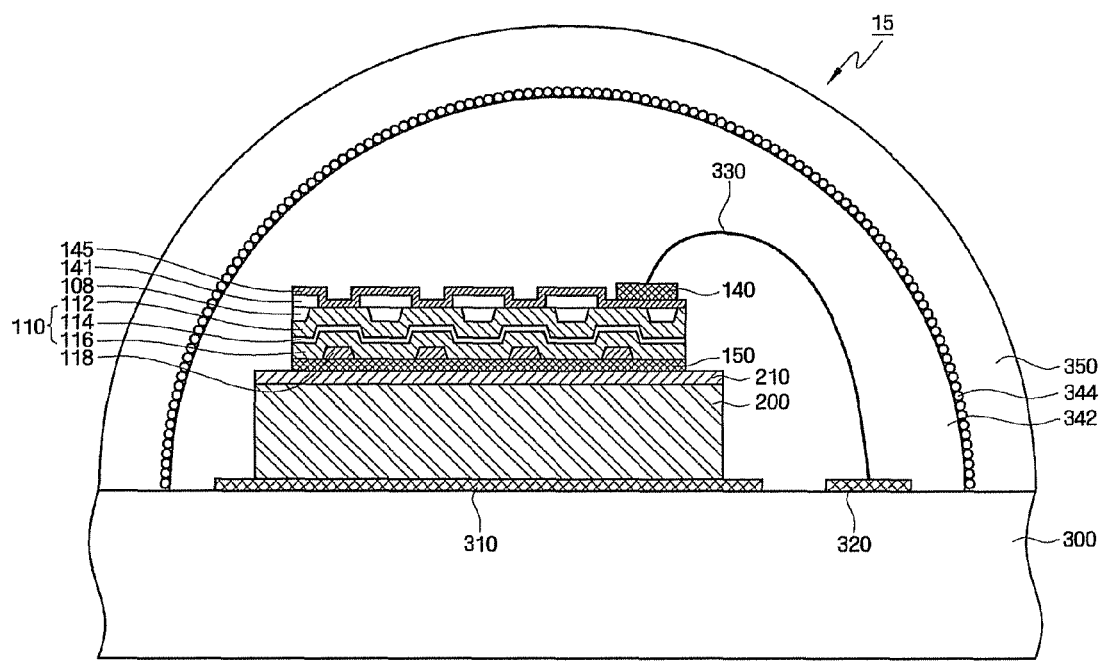

FIG. 12 illustrates a light emitting device according to an example embodiment. Referring to FIG. 12, the light emitting device 15 according to an example embodiment as illustrated in FIG. 12 is different from the light emitting device 13 according to an example embodiment as illustrated in FIG. 10 in that a second transparent resin 342 surrounds the light emitting element 1, and a first transparent resin 350 is formed on a phosphor 344 formed on the second transparent resin 342.

Since the phosphor 344 is coated independently of the second transparent resin 342, rather than being mixed with the second transparent resin 342, the phosphor 344 can be formed conformally along a surface of the second transparent resin 342.

Figure 13:
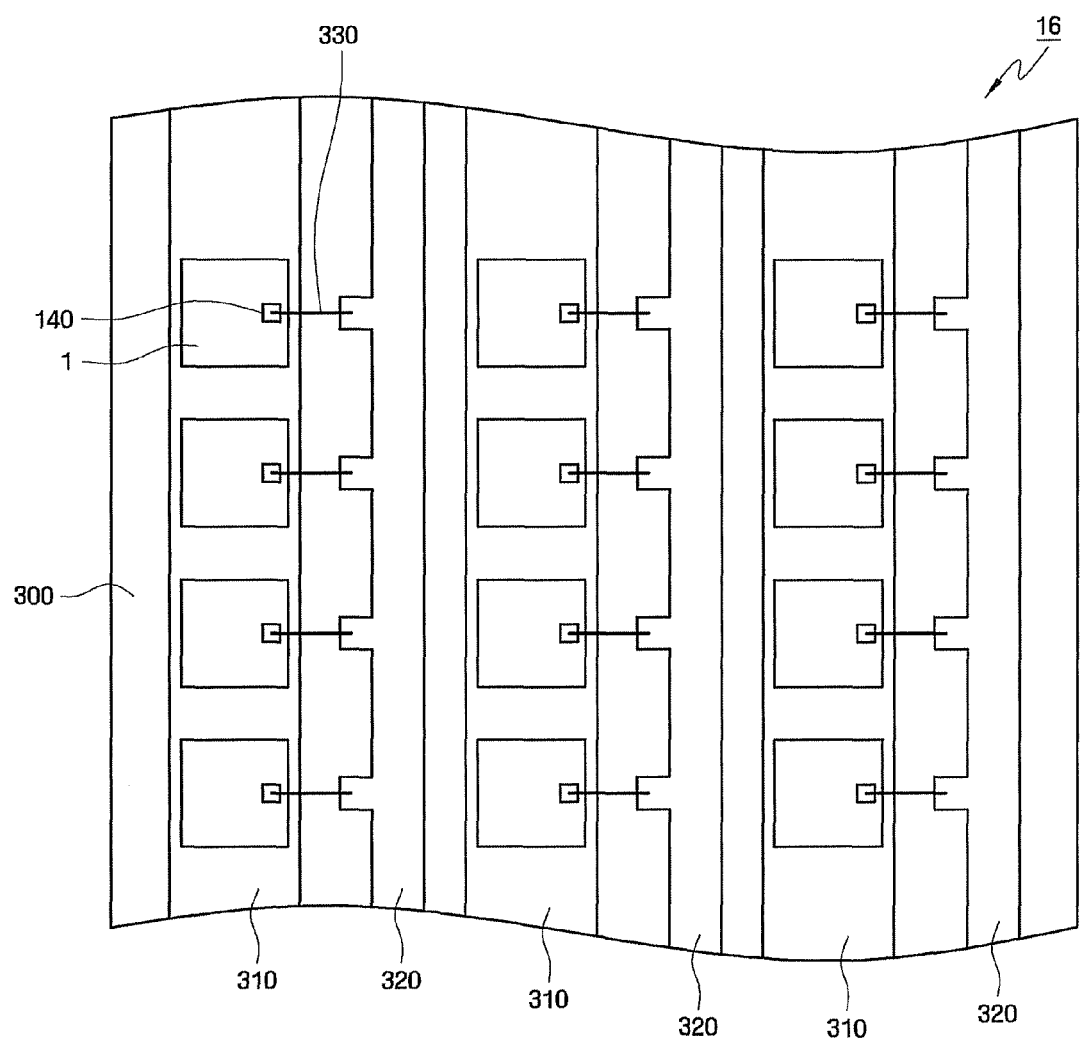
Figure 14:
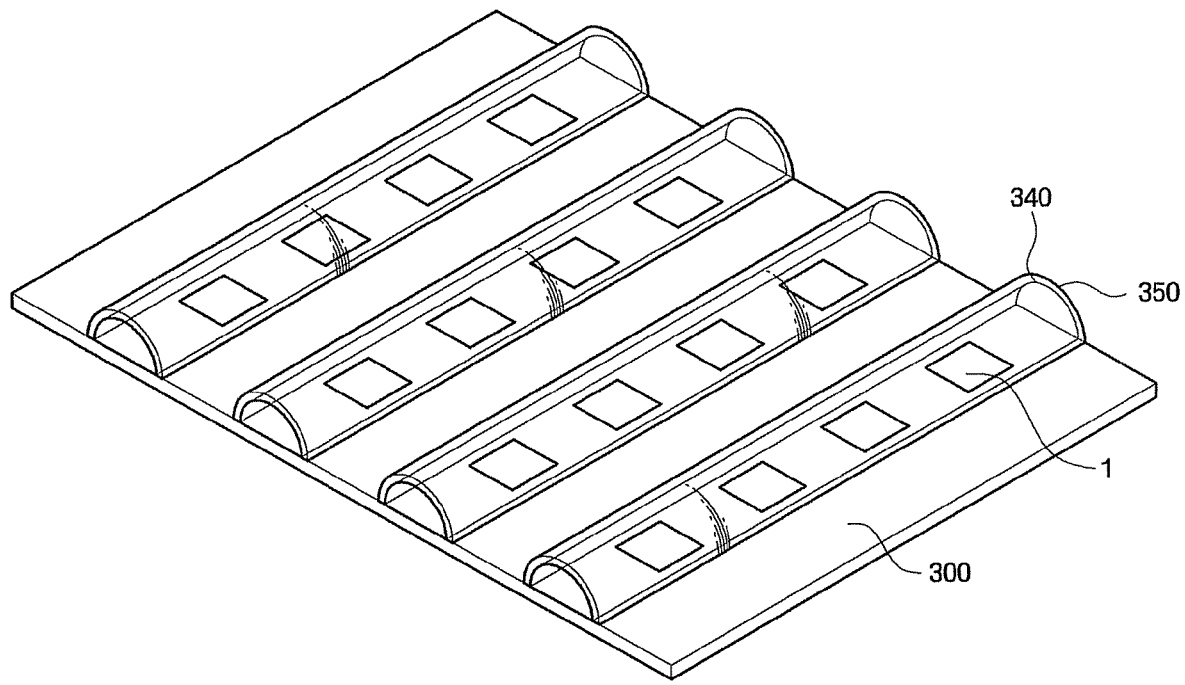
Figure 15:
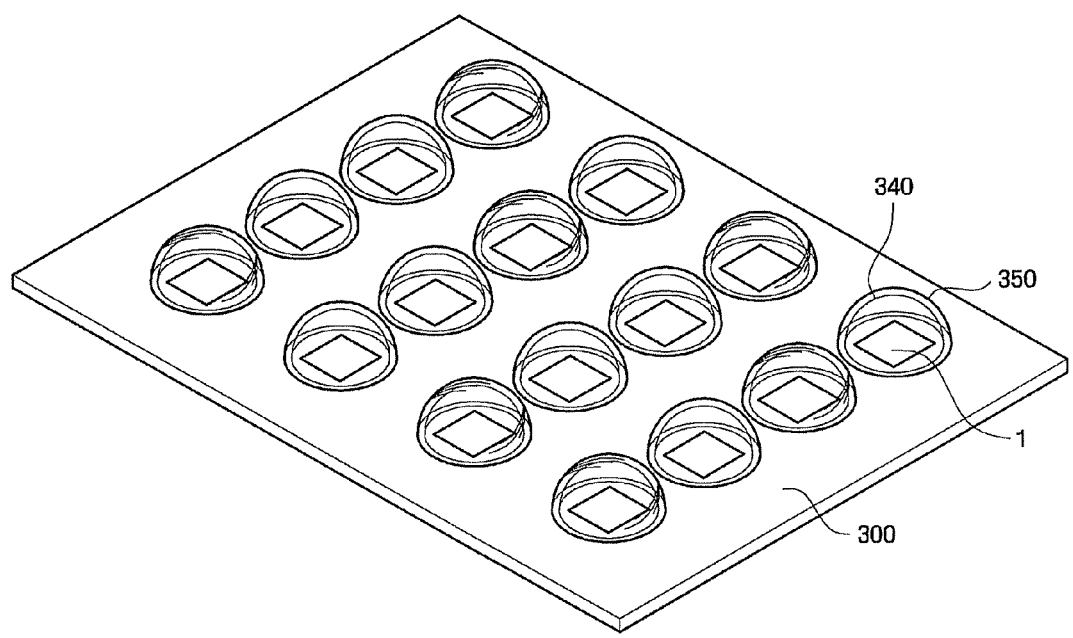

FIGS. 13 through 15 illustrate a light emitting device according to an example embodiment. In detail, FIGS. 13 through 15 illustrate a light emitting array in which a plurality of light emitting elements are arranged on a circuit substrate. In particular, FIGS. 14 and 15 illustrate that a phosphor layer 340 and a first transparent resin 350 are formed on a light emitting array.

Referring first to FIG. 13, a first conductive region 310 and a second conductive region 320 extend on a circuit substrate 300 in parallel in a predetermined or given direction. The light emitting element 1 is disposed on the first conductive region 310 in a line in a direction in which the first conductive region 310 extends. The first electrode 140 and the second conductive region 320 of the light emitting element 1 are connected to each other through a wire 330.

When a bias voltage, e.g., V+ or I+, is applied to the first conductive region 310, and another bias voltage, e.g., V−, I−, or ground voltage, is applied to the second conductive region 310, so that a forward bias is applied to a light emitter (not shown) in the light emitting element 1, the light emitting element 1 emits light.

Referring to FIG. 14, the phosphor layer 340 and the first transparent resin 350 may be formed in a line type. For example, as illustrated in FIG. 14, when the light emitting element 1 is disposed in a direction in which the first conductive region 310 extends, the phosphor layer 340 and the first transparent resin 350 may also be disposed in a direction in which the first conductive region 310 extends. In addition, the phosphor layer 340 and the first transparent resin 350 may be formed to surround the first conductive region 310 and the second conductive region 320.

Referring to FIG. 15, the phosphor layer 340 and the first transparent resin 350 may be formed in a dot type. The phosphor layer 340 and the first transparent resin 350 may be formed to surround only the pertinent light emitting element 1.

Figure 16:
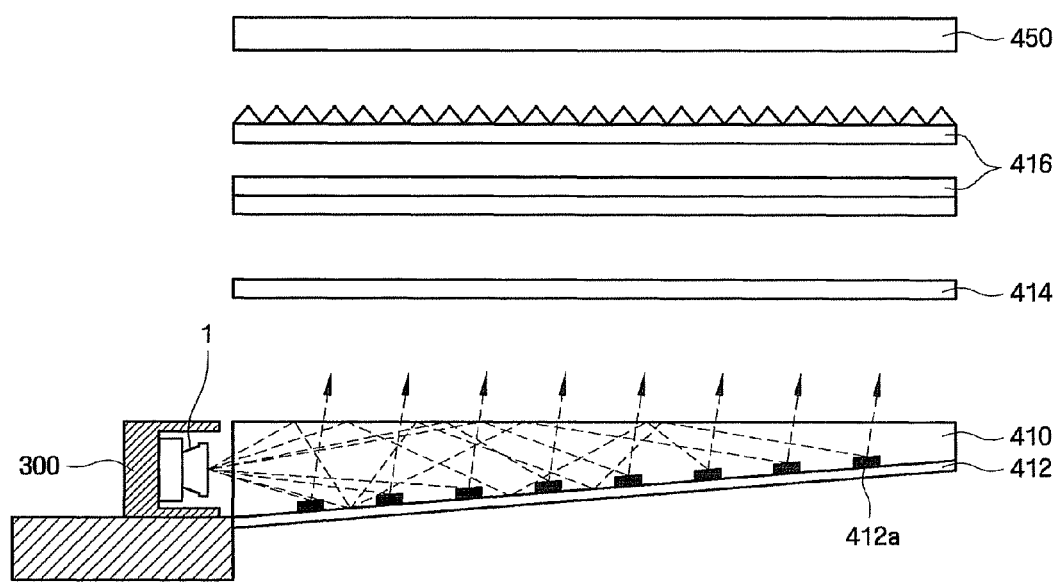

FIG. 16 illustrates a light emitting device according to an example embodiment. The light emitting device illustrated in FIG. 16 is an end product using the light emitting element 1. The light emitting device according to an example embodiment can be applied to various devices including illuminating devices, displays, and mobile devices such as mobile phones, MP3 players, and navigation systems. The end product shown in FIG. 16 is an edge-type back light unit (BLU) for use in a liquid crystal display (LCD). Since an LCD is not a self-emissive display device, a BLU is used as a light source for the LCD and illuminates an LCD panel from the back.

Referring to FIG. 16, the BLU includes a light emitting element 1 on a circuit substrate 300, a light guide plate 410, a reflection sheet 412, a diffusion sheet 414, and a pair of prism sheets 416. The light emitting element 1 serves as a light source to provide light. The light emitting element 1 may be of a side-view type.

The light guide plate 410 guides light that is provided to the liquid crystal panel 450. The light guide plate 410 is a panel made of a transparent plastic material such as acryl and allows light generated by the light emitting package 1 to propagate toward the liquid crystal panel 450 disposed thereon. Thus, the light guide plate 410 has various patterns 412a printed on its rear surface so as to change a propagation direction of incident light toward the liquid crystal panel 450.

The reflection sheet 412 is disposed on a bottom surface of the light guide plate 410 and reflects upward light escaping from the bottom surface of the light guide plate 410. That is, the reflection sheet 412 reflects light not reflected by the various patterns 412a back toward an exit surface of the light guide plate 410. With this configuration, light loss can be reduced and the uniformity of light transmitted through the exit surface of the light guide plate 410 can also be improved.

The diffusion sheet 414 disperses light exiting the light guide plate 410, thereby preventing or reducing a partial concentration of light. Each of the pair of prism sheets 416 has a plurality of triangular prisms periodically arranged on a top surface thereof. The pair of prism sheets 416 may include two sheets with the plurality of triangular prisms arranged in a staggered fashion so that light diffused by the diffusion sheet 414 propagates perpendicular to the liquid crystal panel 450.

FIGS. 17 through 20 illustrate light emitting devices according to example embodiments. The light emitting devices illustrated in FIGS. 17 through 20 are example devices, that is, end products, to which the light emitting devices are applied.

Figure 17:
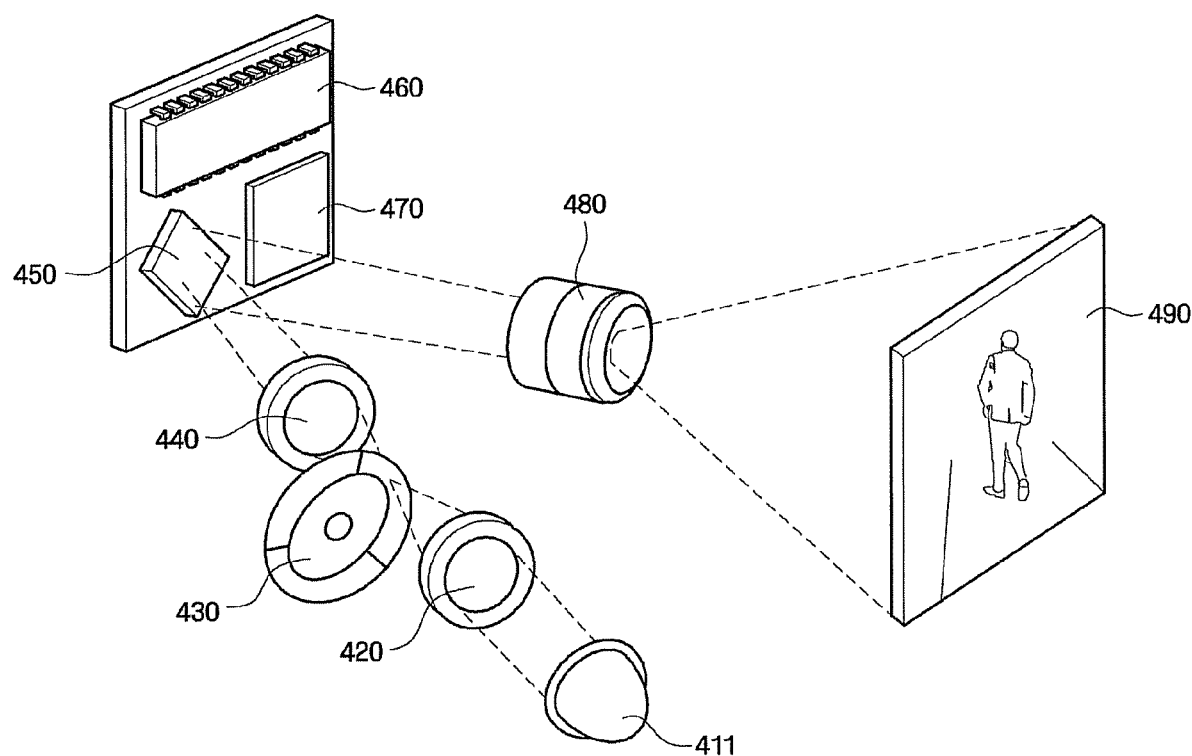
Figure 18:
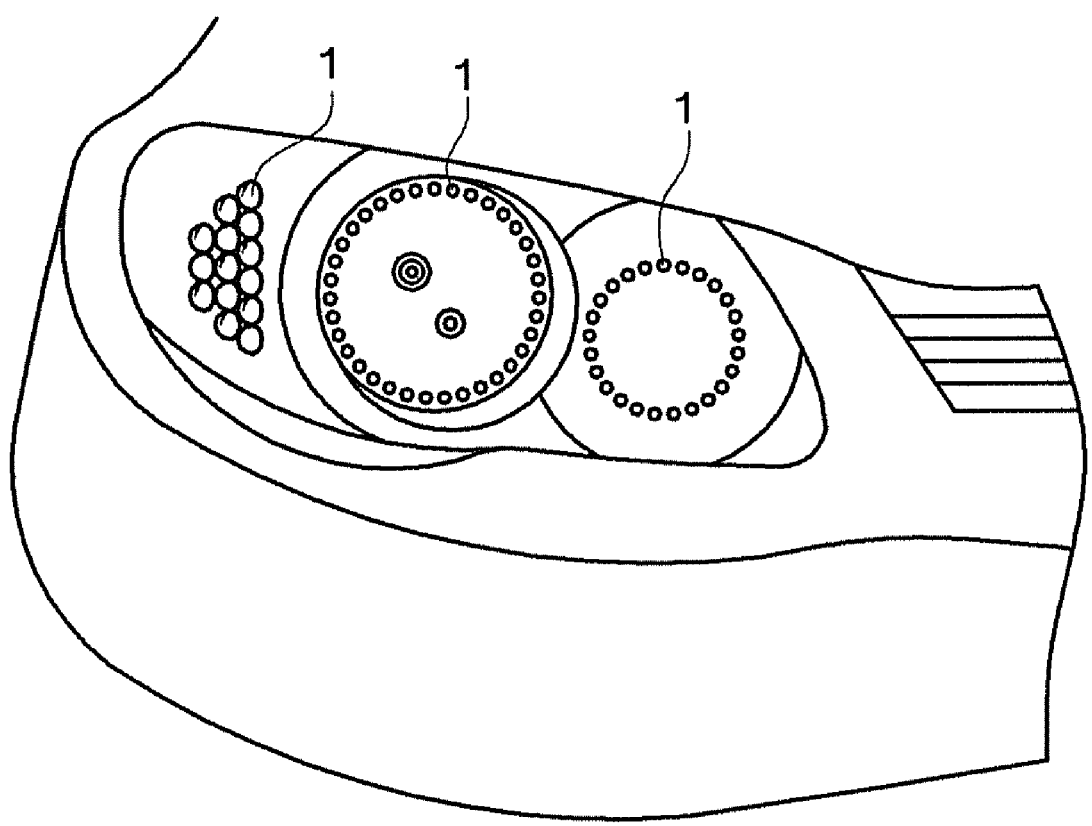
Figure 19:
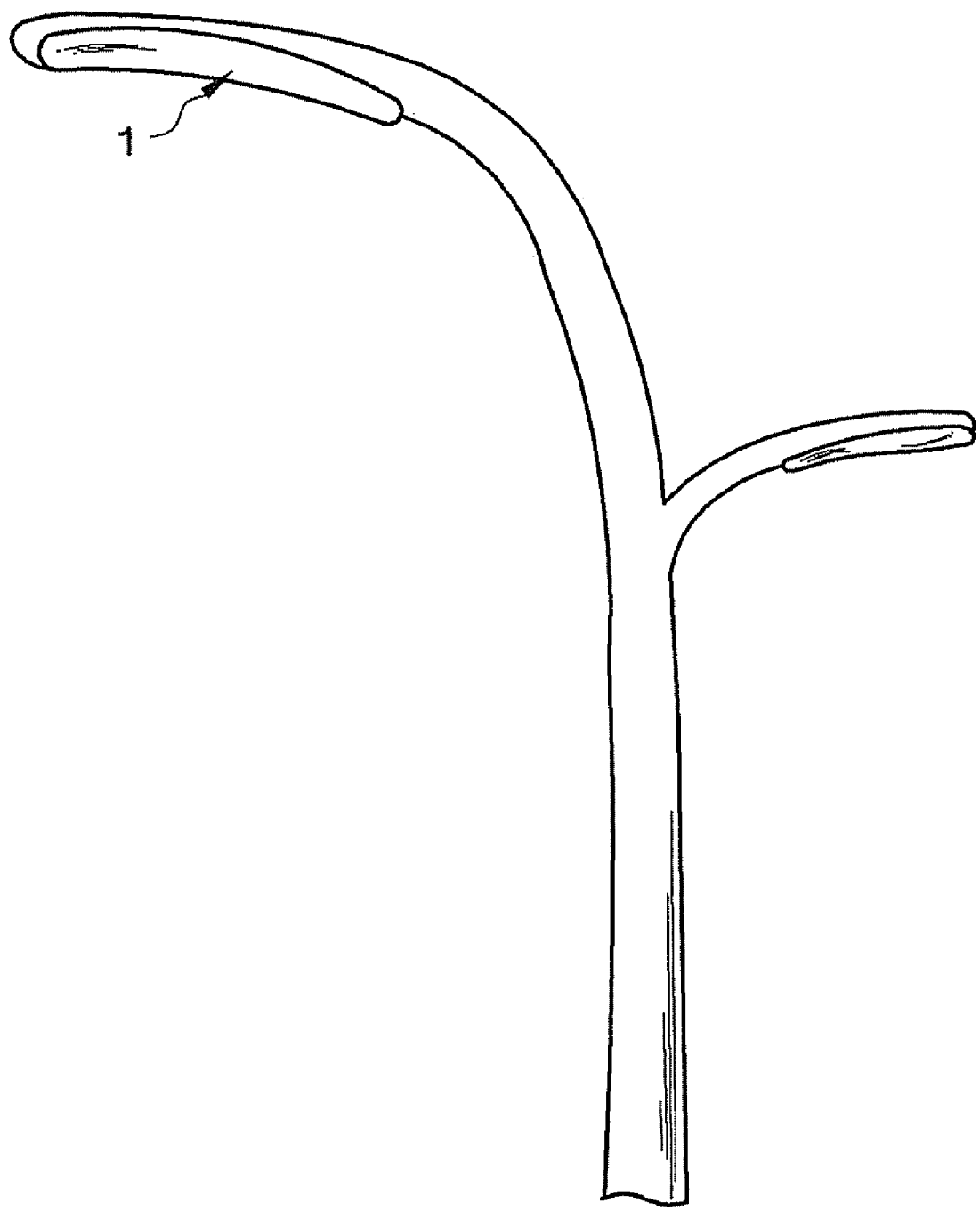
Figure 20:
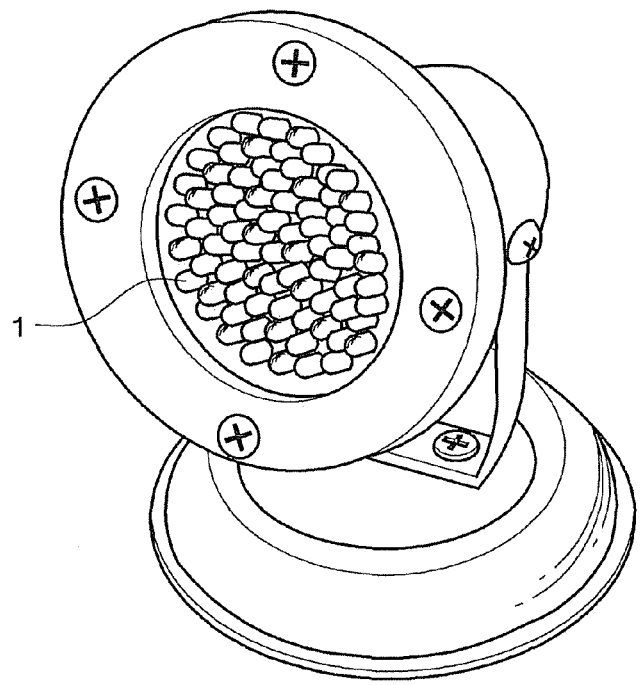

FIG. 17 illustrates a projector, FIG. 18 illustrates a car headlight, FIG. 19 illustrates a street lamp, and FIG. 20 illustrates an illuminating lamp, respectively. The light emitting devices 1 shown in FIGS. 17 through 20 may be of a top-view type.

Referring to FIG. 17, light emitted from a light source 411 passes through a condensing lens 420, a color filter 430, a shaming lens 440, is reflected by a digital micromirror device (DMD) 450, and passes through a projection lens 480 for projection onto a screen 490. The light emitting element 1 according to an example embodiment is disposed within the light source 411.

Figure 21:
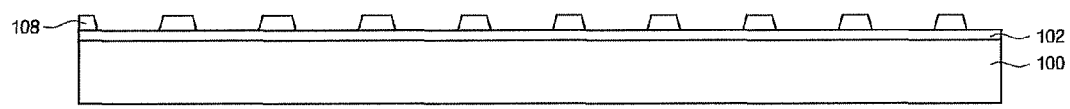
FIGS. 21 through 27 illustrate intermediate process steps for explaining a fabricating method of a light emitting element according to an example embodiment.

FIGS. 21 through 27 illustrate intermediate process steps for explaining a fabricating method of a light emitting element according to an example embodiment. Referring to FIG. 21, a sacrificial layer 102 and a first block pattern 108 are sequentially formed on a substrate 100. The sacrificial layer 102, to be described later, is a layer to be removed when the substrate 100 is lifted off by a laser lift off (LLO) method. The sacrificial layer 102 may be a GaN layer.

Figure 23:
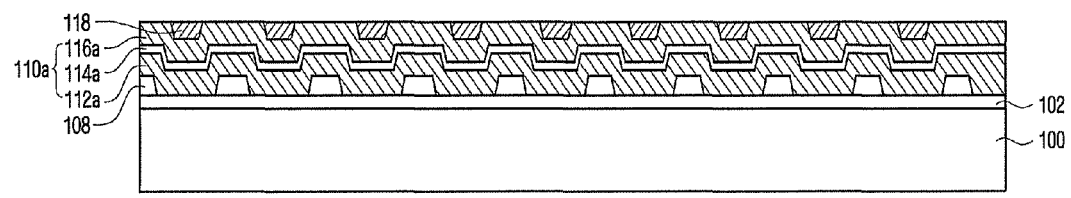
Figure 24:
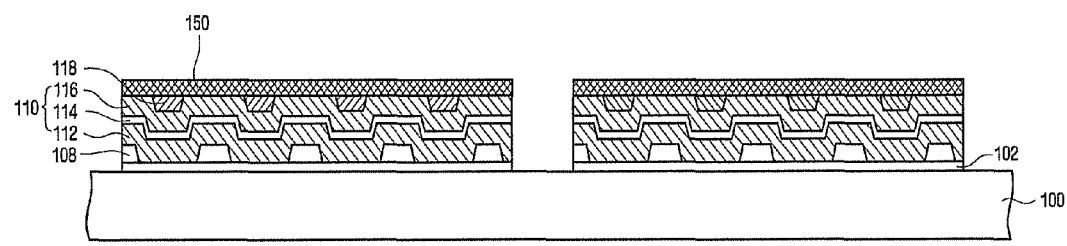

The first block pattern 108 may serve as a seed layer when forming (growing) the first conductive pattern 112 (see FIG. 24). The material of the seed layer may be $In_xAl_yGa_{(1-x-y)}N$ ($0 \leq x \leq 1$, $0 \leq y \leq 1$), and $Si_xC_yN_{(1-x-y)}$ ($0 \leq x \leq 1$, $0 \leq y \leq 1$). Meanwhile, the first block pattern 108 may be patterned in various types, and examples thereof may include a line type (see FIG. 2), a mesh type (see FIG. 3), or a dot type (see FIG. 4). In addition, the second block pattern 118 (see FIG. 23) may be made of an insulating material, and examples thereof may include at least one of oxide, nitride, and oxynitride.

Figure 22:
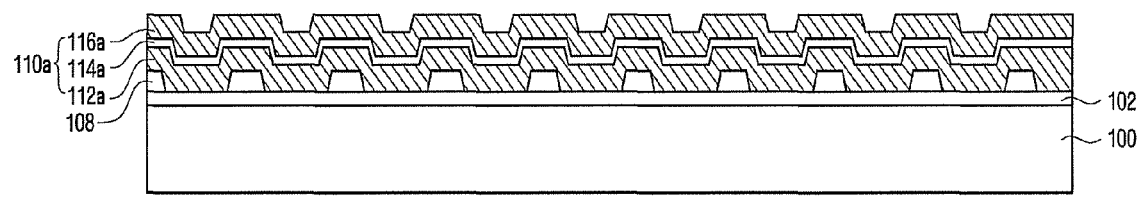

Referring to FIG. 22, the first conductive layer 112a, the light emitting layer 114a, and the second conductive layer 116a are sequentially stacked on the sacrificial layer 102 having the first block pattern 108 formed thereon. The first conductive layer 112a, the light emitting layer 114a, and the second conductive layer 116a, which are sequentially stacked, are to be referred to as a light emitter 110a.

The first conductive layer 112a, the light emitting layer 114a, and the second conductive layer 116a may include $In_xAl_yGa_{(1-x-y)}N$ ($0 \leq x \leq 1$, $0 \leq y \leq 1$). For example, the first conductive layer 112a, the light emitting layer 114a, and the second conductive layer 116a may be AlGaN, or InGaN.

The first conductive layer 112a, the light emitting layer 114a, and the second conductive layer 116a may be sequentially formed by metal organic chemical vapor deposition (MOCVD), liquid phase epitaxy, hydride vapor phase epitaxy, molecular beam epitaxy, or metal organic vapor phase epitaxy (MOVPE).

After forming the second conductive layer 116a, annealing may be performed to activate the second conductive layer 116a. For example, the annealing may be at a temperature of about 400° C. In detail, when the second conductive layer 116a is, for example, an Mg-doped $In_xAl_yGa_{(1-x-y)}N$ layer, the annealing may separate hydrogen (H) bonded to Mg from the layer, thereby ensuring the second conductive layer 116a to demonstrate a p-type characteristic.

The light emitter 110a may be defined by a first portion formed on the second block pattern 118, and a second portion formed between two adjacent second block patterns 118, and a top surface of the second portion is formed lower than that of the first portion to define a recessed region at a region between the two adjacent first portions (that is, an upper portion of the second portion).

Referring to FIG. 23, the second block pattern 118 is formed on the light emitter 110a to fill the recessed region. The first block pattern 118 may be a semiconductor material having a conductivity type (e.g., n type) different from that of the second conductive layer 116a (e.g., p type). As illustrated, a top surface of the light emitter 110a and a top surface of the first block pattern 118 may become planarized, but example embodiments may not be limited thereto.

Referring to FIG. 24, the second conductive layer 116a, the light emitting layer 114a, and the first conductive layer 112a are etched to form the light emitter 110 including the second conductive pattern 116, the light emitting pattern 114, and the first conductive pattern 112.

The second electrode 150 may be formed on the light emitter 110. The second electrode 150 may be made of a highly reflective material. For example, the second electrode 150 may include at least one of silver (Ag) and aluminum (Al). Although not illustrated, an ohmic layer may be formed between the light emitter 110 and the second electrode 150.

Figure 25:
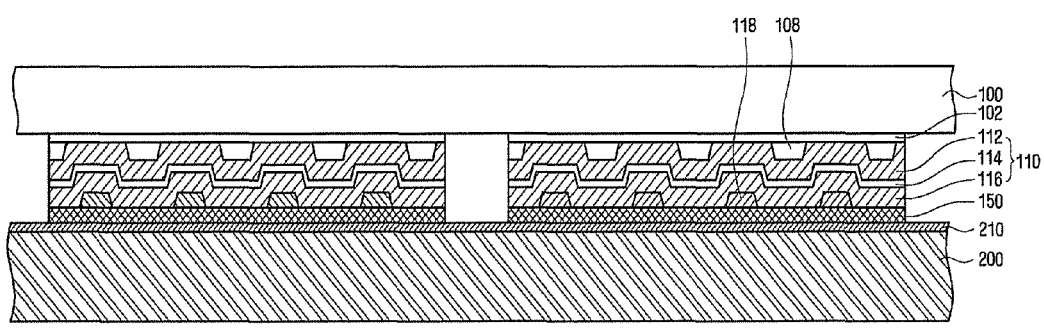

Referring to FIG. 25, a substrate 100 is bonded onto a conductive substrate 200. The conductive substrate 200 may be a conductive substrate, and examples thereof may include Si, strained Si, Si alloy, SOI (Silicon-On-Insulator), SiC, SiGe, SiGeC, Ge, Ge alloy, GaAs, InAs, one of Group III-V semiconductors, one of Group II-VI semiconductors, composites of these materials, and stacks thereof.

The substrate 100 or the conductive substrate 200 may be substantially flat. If the substrate 100 or the conductive substrate 200 is not flat, that is, warped, bonding is difficult to perform. Since an intermediate material layer 210 is disposed between the substrate 100 and the conductive substrate 200, which will later be described, the intermediate material layer 210 can compensate for the substrate 100 or the conductive substrate 200 that is slightly warped (particularly when the intermediate material layer 210 is sufficiently thick).

For example, the conductive substrate 200 and the substrate 100 may be bonded to each other by adhesive bonding, which will be described in detail. The conductive substrate 200 and the substrate 100 are cleaned. Maintaining a bonding surface of the conductive substrate 200 and a bonding surface of the substrate 100 at clean states is desirable.

Various impurities sticking to surfaces of the conductive substrate 200 and the substrate 100, for example, particles, or dust, may become contamination sources. When the conductive substrate 200 and the substrate 100 are bonded to each other, the impurities existing between the conductive substrate 200 and the substrate 100 may weaken the bonding energy therebetween. If the bonding energy is weak, the conductive substrate 200 and the substrate 100 are readily separated from each other.

The intermediate material layer 210 is formed on the bonding surface of the conductive substrate 200 or the bonding surface of the substrate 100. For convenience of illustration, FIG. 25 illustrates that the intermediate material layer 210 is formed on the bonding surface of the conductive substrate 200. Although not illustrated, the intermediate material layer 210 may further be formed conformally along a profile of the first electrode 140 of the substrate 100. Alternatively, after forming the intermediate material layer 210 on a top surface of the second electrode 150 of the light emitter 110, the intermediate material layer 210 may be bonded to the conductive substrate 200.

The intermediate material layer 210 may be made of a conductive material, and examples thereof may include a metal layer. When the intermediate material layer 210 is a metal layer, the intermediate material layer 210 may include, for example, at least one of Au, Ag, Pt, Ni, Cu, Sn, Al, Pb, Cr, and Ti. The metal layer may be a single layer made of Au, Ag, Pt, Ni, Cu, Sn, Al, Pb, Cr, or Ti, a stack thereof, or a composite thereof. For example, the metal layer may be a single layer of Au, a double layer of Au—Sn, or a multi-layer having alternatively stacked layers of Au and Sn. The intermediate material layer 210 may be made of a material having a lower reflective index than the second electrode 150.

The second electrode 150 formed on the substrate 100 is allowed to face the bonding surface of the conductive substrate 200. Subsequently, the conductive substrate 200 and the substrate 100 are bonded to each other by annealing. While performing the annealing, the conductive substrate 200 and the substrate 100 may be subjected to thermal compression to be bonded to each other.

For example, when a single layer of Au is used as the intermediate material layer 210, the thermal compression may be performed at a temperature ranging from about 200° C. to about 450° C., which is, however, appropriately adjusted by one skilled in the art.

Figure 26:
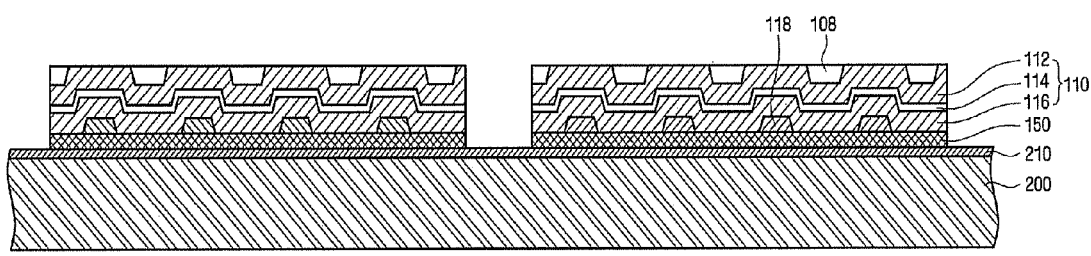

Referring to FIG. 26, the substrate 100 is removed. Removing the substrate 100 may be performed by a laser lift off (LLO) method. In detail, since a laser is irradiated from the substrate 100 and has a relatively small area, the substrate 100 having a relatively wide area is scanned, and the sacrificial layer 102 is removed using the laser. Then, the substrate 100 starts to lift off from a portion from which the laser is irradiated.

In order to prevent or reduce the light emitting element from being damaged by the laser lift off method, a thickness of the substrate 100 may be reduced prior to the laser lift off method. As described above, since the substrate 100 is sequentially removed from the laser irradiated portion, the light emitter 110 may be broken or damaged by a physical force when the substrate 100 is removed. However, the physical force when the substrate 100 is removed is reduced by reducing a thickness of the substrate 100 by CMP (Chemical Mechanical Polishing), thereby preventing or reducing damage to the light emitter 110.

Figure 27:
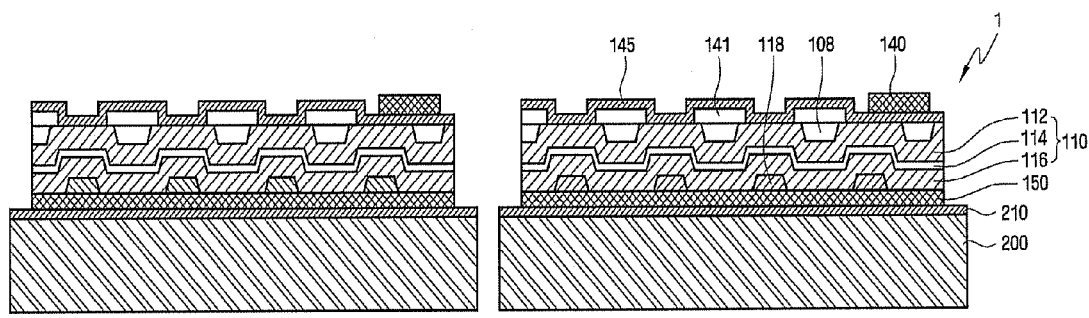

Referring to FIG. 27, the first block pattern 108 exposed by removing the substrate 100 is removed, thereby forming the insulation pattern 141 conformally along a profile of the first block pattern 108. Although not illustrated in FIG. 27, the insulation pattern 141 may not be formed.

The ohmic layer 145 and the first electrode 140 are formed. The ohmic layer 145 may include, for example, at least one of ITO (Indium Tin Oxide), zinc (Zn), zinc oxide (ZnO), silver (Ag), titanium (Ti), aluminum (Al), gold (Au), nickel (Ni), indium oxide ($In_2O_3$), tin oxide ($SnO_2$), copper (Cu), tungsten (W), and platinum (Pt). The first electrode 140 may include at least one of indium tin oxide (ITO), copper (Cu), nickel (Ni), chrome (Cr), gold (Au), titanium (Ti), platinum (Pt), aluminum (Al), vanadium (V), tungsten (W), molybdenum (Mo), and silver (Ag).

A sawing process is performed to separate the resultant structure in units of chips, thereby completing the light emitting element 1. One skilled in the art to which the present invention pertains can deduce a fabricating method in accordance with all example embodiments, and a repeated explanation thereof will not be given.

Although the present invention has been described in connection with example embodiments with reference to the accompanying drawings, it will be apparent to those skilled in the art that various modifications and changes may be made thereto without departing from the scope and spirit of the invention. Therefore, it should be understood that the above example embodiments are not limitative, but illustrative in all aspects.

What is claimed is:

1. A light emitting element comprising:
a first block pattern formed on a substrate;
a light emitter including a first semiconductor pattern of a first conductivity type, a light emitting pattern, and a second semiconductor pattern of a second conductivity type, sequentially stacked on the substrate having the first block pattern formed thereon, the light emitter having a first portion formed on the first block pattern, and a second portion formed between two adjacent first block patterns, the second portion formed lower than the first portion to define a recessed region; and
a second block pattern formed on the light emitter to fill the recessed region,
wherein the substrate is a conductive substrate, the first block pattern is a third semiconductor pattern of a second conductivity type, and the second block pattern serves as a seed layer when forming the first semiconductor pattern.

2. The light emitting element of claim 1, wherein at least one of the first block pattern and the second block pattern is a third semiconductor pattern serving as a Schottky barrier.

3. The light emitting element of claim 1, wherein the substrate is an insulating substrate, the first block pattern serves as a seed layer when forming the first semiconductor pattern, and the second block pattern is a third semiconductor pattern of a first conductivity type.

4. The light emitting element of claim 1, wherein the first block pattern and the second block pattern are complementary to each other.

5. The light emitting element of claim 1, wherein each of the first and second block patterns has a shape of at least one type of a dot, a mesh and a line.

6. The light emitting element of claim 1, further comprising:
an insulation pattern conformally formed on the second block pattern; and
an ohmic layer formed on the light emitter and the insulation pattern.

7. The light emitting element of claim 1, further comprising:
a first electrode between the substrate and the first block pattern and electrically connected to the first semiconductor pattern; and
a second electrode electrically connected to the second semiconductor pattern.

8. A light emitting device comprising:
a light emitting element on a circuit substrate, the light emitting element including,
a first block pattern formed on a substrate;
a light emitter including a first semiconductor pattern of a first conductivity type, a light emitting pattern, and a second semiconductor pattern of a second conductivity type, sequentially stacked on the substrate having the first block pattern formed thereon, the light emitter having a first portion formed on the first block pattern, and a second portion formed between two adjacent first block patterns, the second portion formed lower than the first portion to define a recessed region; and
a second block pattern formed on the light emitter to fill the recessed region,
wherein the substrate is a conductive substrate, the first block pattern is a third semiconductor pattern of a second conductivity type, and the second block pattern serves as a seed layer when forming the first semiconductor pattern.

9. The light emitting device of claim 8, wherein the circuit substrate includes a first conductive region and a second conductive region on one surface of the circuit substrate, the first and second conductive regions electrically disconnected from each other.

10. The light emitting device of claim 8, wherein at least one of the first block pattern and the second block pattern is a third semiconductor pattern serving as a Schottky barrier.

11. The light emitting device of claim 8, wherein the substrate is an insulating substrate, the first block pattern serves as a seed layer when forming the first semiconductor pattern, and the second block pattern is a third semiconductor pattern of a first conductivity type.

12. The light emitting device of claim 8, further comprising:
an insulation pattern conformally formed on the second block pattern; and
an ohmic layer formed on the light emitter and the insulation pattern.

13. The light emitting device of claim 9, further comprising:
a first electrode between the substrate and the first block pattern and electrically connected to the first semiconductor pattern; and
a second electrode electrically connected to the second semiconductor pattern.

14. The light emitting device of claim 13, wherein the first conductive region is electrically connected to the second electrode, and the second conductive region is electrically connected to the first electrode through a wire.

15. The light emitting device of claim 8, further comprising:
a phosphor layer surrounding the light emitting element; and
a first transparent resin surrounding the phosphor layer.

16. The light emitting device of claim 15, wherein the phosphor layer is a mixture of a second transparent resin and a phosphor.

17. The light emitting device of claim 8, further comprising:
a phosphor formed conformally along a profile of the light emitting element and the circuit substrate; and
a transparent resin surrounding the light emitting element.

18. The light emitting device of claim 8, further comprising:
a first transparent resin surrounding the light emitting element;
a phosphor formed on the first transparent resin; and
a second transparent resin formed on the phosphor.

* * * * *